US008546251B1

(12) United States Patent
Sachan et al.

(10) Patent No.: US 8,546,251 B1
(45) Date of Patent: Oct. 1, 2013

(54) COMPACT READ ONLY MEMORY CELL

(75) Inventors: Vineet Kumar Sachan, Ghaziabad (IN);
Amit Khanuja, New Delphi (IN);
Deepak Sabharwal, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 265 days.

(21) Appl. No.: 12/346,866

(22) Filed: Dec. 31, 2008

(51) Int. Cl.
*H01L 21/3205* (2006.01)
*H01L 21/4763* (2006.01)

(52) U.S. Cl.
USPC .................. 438/592; 257/390; 257/E21.645; 365/94; 365/104

(58) Field of Classification Search
USPC .................................. 257/390; 438/128–129
See application file for complete search history.

(56) References Cited

U.S. PATENT DOCUMENTS 5,332,917 A * 7/1994 Lee et al. .................. 257/390
6,147,893 A * 11/2000 Liu ............................. 365/104

* cited by examiner

*Primary Examiner* — Julio J Maldonado
*Assistant Examiner* — Sonya D McCall Shepard
(74) *Attorney, Agent, or Firm* — Baker Botts L.L.P.

(57) ABSTRACT

A method of manufacturing a read only memory cell includes connecting electrically a drain of the transistor to the bit line with a first conductor and a via. The method also includes generating a logic zero at a source of the transistor by electrically connecting the source of the transistor to a ground line with the first conductor. Further, the method includes, programming the read only memory cell to logic zero. A method of manufacturing a read only memory cell includes connecting electrically a drain of the transistor to the bit line with a first conductor and a via. The method also includes, connecting electrically a source of the transistor to the drain with the first conductor. Further, the method includes programming the read only memory cell to logic one.

20 Claims, 7 Drawing Sheets

FIG. 1 [PRIOR ART]

COMPACT READ ONLY MEMORY CELL

FIELD

The present disclosure relates in general to a read only memory cell and more particularly to manufacture a compact read only memory cell.

BACKGROUND

A read only memory cell includes a single transistor. The transistor of the read only memory cell includes a drain, a gate, a source, a first conductor, a second conductor, and via. Further, a bit line is provided to a drain of a transistor, a word line is provided to the gate of the transistor and the source of the transistor is connected to the ground. The transistor of the read only memory cell is either programmed to logic zero or logic one.

FIG. 1 is a Prior Art illustrating a traditional read only memory cell 100 design. The Prior Art includes a drain 105, a source 110, and a poly layer 115. The read only memory cell 100 also includes a first conductor 120 connected to the drain 105, Further, the read only memory cell 100 includes another first conductor 130 connected to the source 110, Furthermore, the read only memory cell 100 includes a second conductor bit line 125, and a second conductor ground line 135. A connection can be established between the drain 105, the first conductor 120, the source 110, another first conductor 130, the second conductor 125 and another second conductor 135 in various ways depending on the programming of the read only memory cell 100 either to logic zero or logic one. The various ways of programming the read only memory cell 100 is done by using the contact areas A, B, C and D as shown in the Prior Art.

A method for programming logic zero on a read only memory cell 100 in the existing technique includes connecting the first conductor 120 to the second conductor 125 over a contact area A and connecting the first conductor 130 to the second conductor 135 over a contact area D. As another method of programming logic zero on a read only memory cell 100 includes connecting the first conductor 120 to second conductor 135 over a contact area B and connecting the first conductor 130 to second conductor 125 over a contact area C.

The method for programming logic one on a read only memory cell 100 includes connecting the first conductor 120 to a second conductor 125 over a contact area A and connecting the first conductor 130 to a second conductor 125 over a contact area C. As another method of programming logic one on a read only memory cell 100 includes connecting the first conductor 120 to a second conductor 135 over a contact area B and connecting the first conductor 130 to the second conductor 135 over a contact area D.

However, in the existing systems, the read only memory cell requires minimum area of first conductor to be present in the base read only memory cell. Both the first conductor 120 and the first conductor 130 have to adhere to the minimum area requirement of the design rules, hence limiting the size of read only memory cell.

In addition, in the existing read only memory cell, even though the second conductor 135 is a ground line and is electrically common between the two adjacent columns, it cannot be physically shared because the regions B and D can be unique for the two adjacent cells. This further limits the physical size of the read only memory cell.

In light of the foregoing discussion, there is a need of an efficient technique for manufacturing a compact read only memory cell.

SUMMARY

Embodiments of the present disclosure described herein provide a method for manufacturing a compact read only memory cell.

An example of a method for manufacturing a read only memory cell includes connecting a ground line to a first conductor and sharing the ground line between adjacent columns. The method also includes connecting a bit line to a second conductor and providing a word line to a gate of a transistor. Further, the method includes connecting electrically a drain of the transistor to the bit line with a first conductor and a via. Furthermore, the method includes generating a logic zero at a source of the transistor by electrically connecting the source of the transistor to a ground line with the first conductor. Moreover, the method includes programming the read only memory cell to logic zero.

Another example of a method for manufacturing a read only memory cell includes connecting a ground line to a first conductor and sharing the ground line between adjacent columns. The method also includes connecting a bit line to a second conductor and providing a word line to a gate of a transistor. Further, the method includes connecting electrically a drain of the transistor to the bit line with a first conductor and a via. Furthermore the method includes connecting electrically a source of the transistor to the drain with the first conductor. Moreover the method includes, programming the read only memory cell to logic one.

Yet another example of a method for manufacturing a read only memory cell includes connecting a ground line to a first conductor and sharing the ground line between adjacent columns. The method also includes connecting a bit line to a second conductor and providing a word line to a gate of a transistor. Further the method includes, connecting electrically a drain of the transistor to the ground line with the first conductor. Furthermore, the method includes connecting electrically a source of the transistor to the ground line with the first conductor. Moreover the method includes programming the read only memory cell to logic one.

An example of a read only memory cell includes a first conductor at a gate, a drain, and a source of a transistor. The read only memory cell also includes a plurality of electrically grounded second conductor. Further, the read only memory cell includes, vias connecting the read only memory cell to another read only memory cell based on logic zero or logic one.

DETAILED DESCRIPTION OF THE EMBODIMENTS

Embodiments of the present disclosure provide a method and a system for manufacturing a compact read only memory cell.

Figure 1:
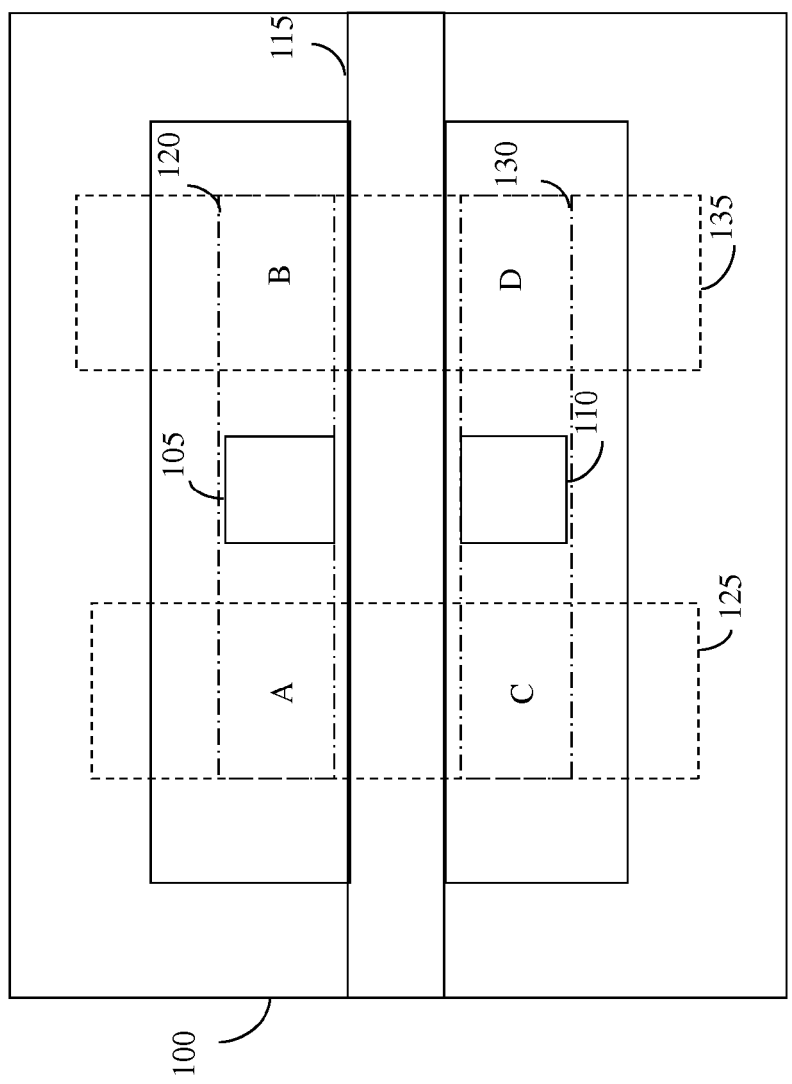
FIG. 1 is a Prior Art exemplary illustrating an existing read only memory cell.
Figure 2:
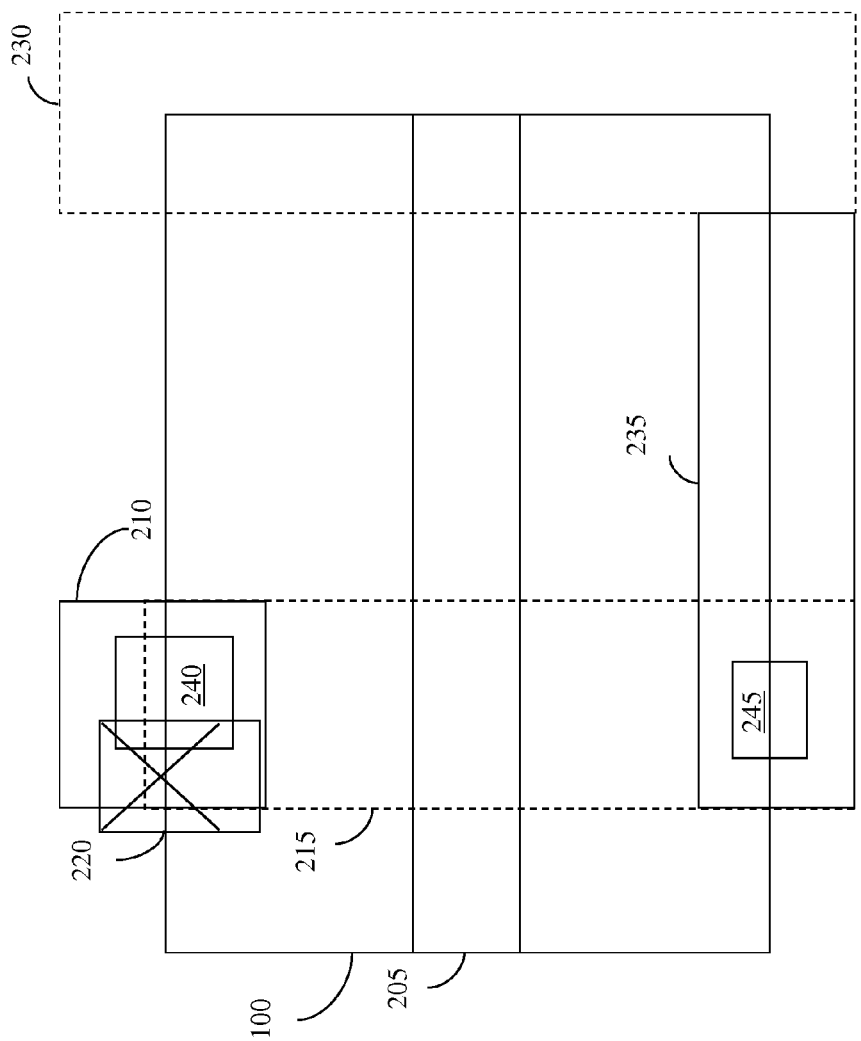
FIG. 2 is an exemplary illustration of manufacturing a read only memory cell in accordance with one embodiment.

FIG. 2 is an exemplary illustration of manufacturing a read only memory cell in accordance with one embodiment. Further the read only memory 100 cell is programmed to logic zero in accordance with one embodiment. The read only memory cell 100 includes a poly layer 205, a first conductor 210, and a second conductor 215. The read only memory cell 100 also includes a via 220 and drain and source contacts. A bit line is provided to a drain 240 of a transistor and a word line is provided to a gate of the transistor. The drain 240 of the transistor is electrically connected to a bit line with a first conductor 210 and a via 220. The A source 245 of the transistor is connected to ground line with a first ground conductor 235.

Manufacturing the read only memory cell 100 and programming the read only memory cell 100 to logic zero includes, connecting the drain 240 of the transistor to a second conductor 215 using the first conductor 210 and the via 220. The source 245 of the transistor is then connected to the first conductor 230 using the first ground conductor 235. The first ground conductor 235 meets the minimum area design rules after programming the read only memory cell 100 to logic zero and thereby reducing the physical size of the read only cell over existing techniques.

In one embodiment of the present disclosure, manufacturing the read only memory cell 100 and programming the read only memory cell 100 to logic zero includes pre-charging and discharging of the bit line, and the inputs provided by the word line.

Figure 3:
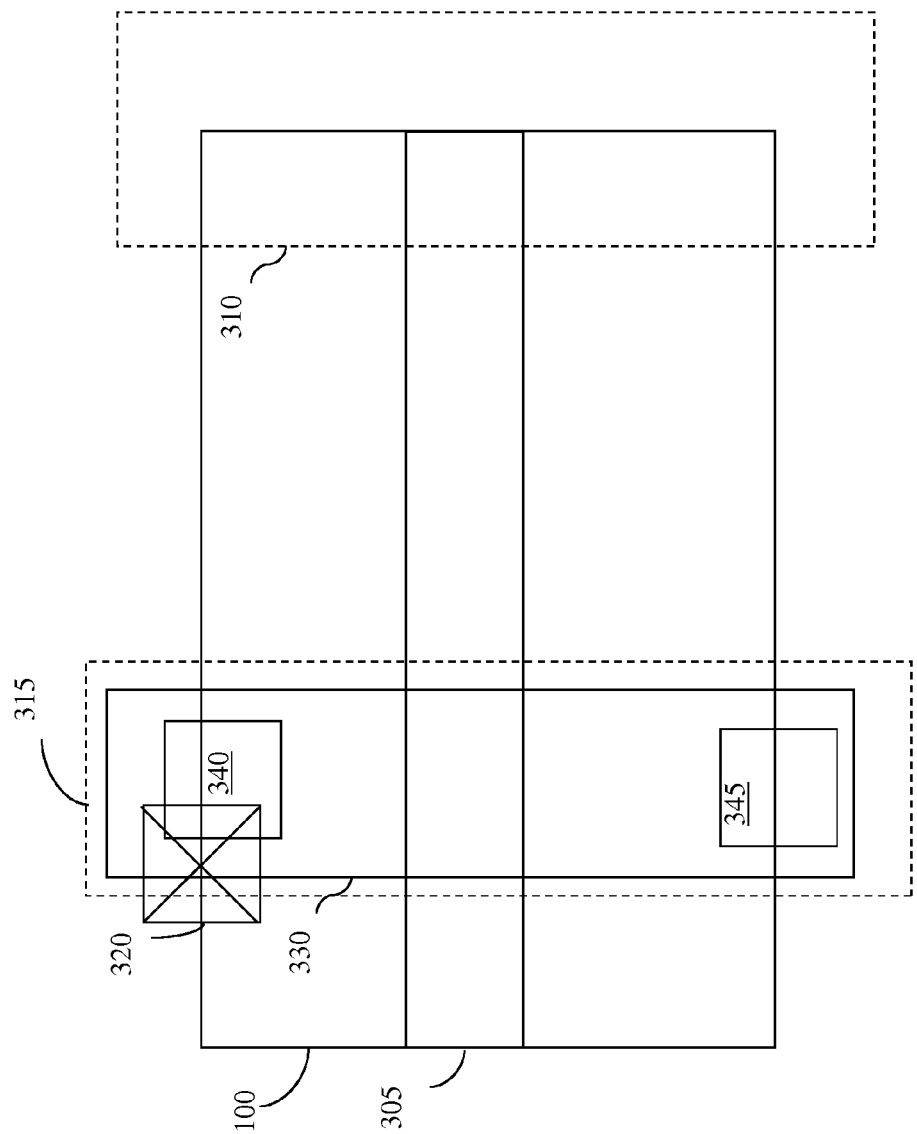
FIG. 3 is an exemplary illustration of manufacturing a read only memory cell, in accordance with another embodiment.

FIG. 3 is an exemplary illustration of manufacturing a read only memory cell, in accordance with another embodiment. The read only memory cell 100 includes a poly layer 305, a first conductor 310, another first conductor 330 and a second conductor 315. The read only memory cell 100 also includes a via 320 and drain and source contacts 325A and 325B, respectively.

Manufacturing a read only memory cell 100 for programming the read only memory cell to logic one includes, connecting the drain 340 of the transistor to a second conductor 315 using the first conductor 330 and a via 320. The drain 340 and the source 345 of the transistor are then connected with the first conductor 330. This ensures both the source and drain contacts, are covered with the same first conductor and hence meeting all design rules. The connection also ensures that both the drain 340 and source 345 of the transistor are physically connected to each other and the bit line.

Figure 4:
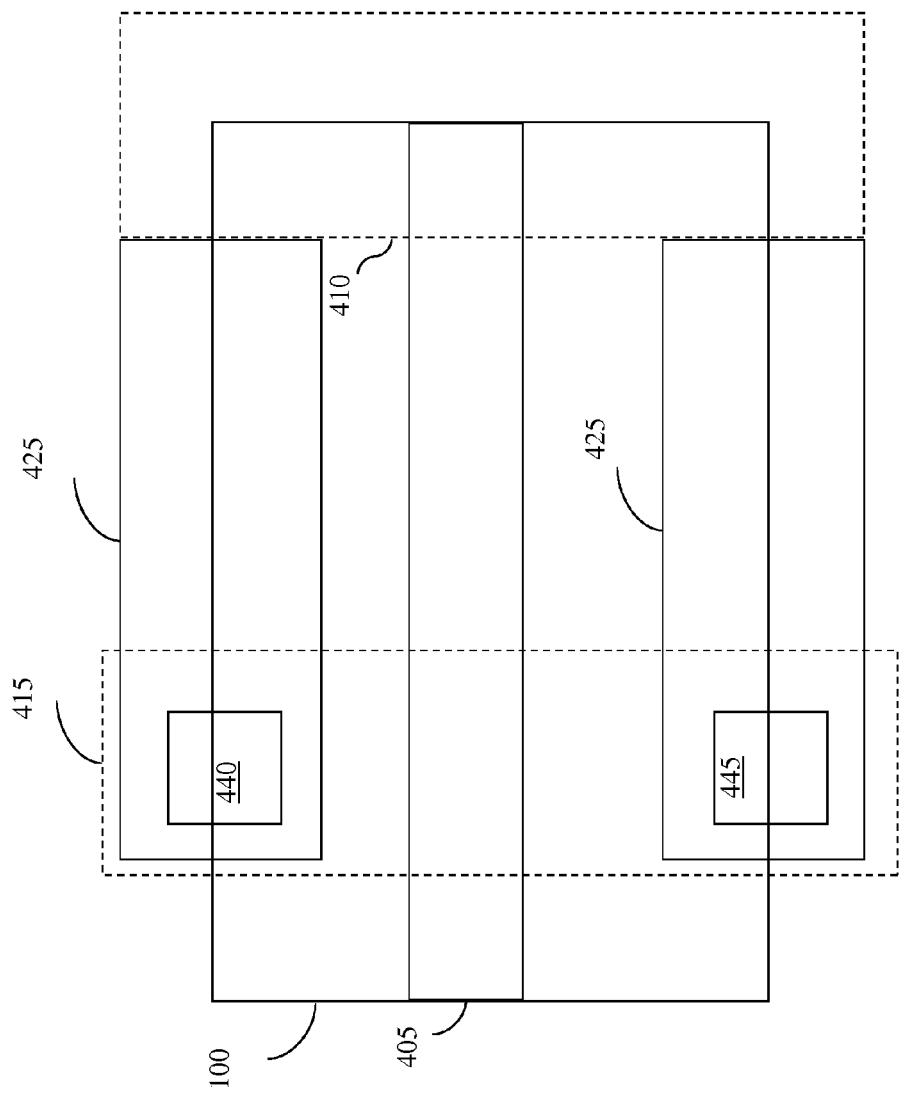
FIG. 4 is an exemplary illustration of manufacturing a read only memory cell, in accordance with yet another embodiment.

FIG. 4 is an exemplary illustration of manufacturing a read only memory cell, in accordance with yet another embodiment. The read only memory cell 100 includes a poly layer 405, a first ground conductor 410, and a second conductor 415. The read only memory cell 100 also includes drain and source contacts.

The manufacturing of the read only memory cell 100 for programming the read only memory cell 100 to logic one includes, connecting the drain 440 and the source 445 of the transistor to the first ground conductor 410 using a first conductor 425. This ensures both the source and drain contacts are covered with the same first conductor and hence meeting all design rules. The connection also ensures that both the drain 440 and source 445 of the transistor are physically connected to each other and to the ground line.

Figure 5:
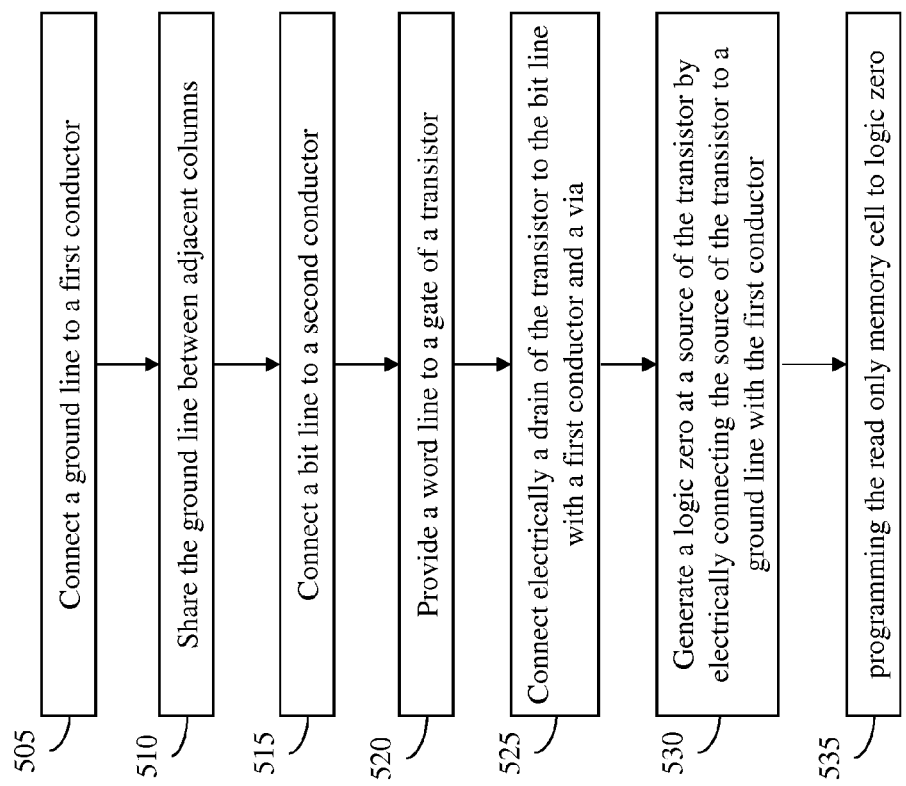
FIG. 5 is an exemplary flowchart of a method for manufacturing a read only memory cell, in accordance with one embodiment.

FIG. 5 is an exemplary flowchart of a method for manufacturing a read only memory cell, in accordance with one embodiment;

At step 505, a ground line is connected to the first conductor. At step 510, a ground line is shared between adjacent columns. At step 515, a bit line is connected to a second conductor. At step 520, a word line is connected to the gate of a transistor. At step 525, a drain of the transistor is electrically connected to the bit line with a first conductor and a via. At step 530, a logic zero is generated at a source of the transistor by electrically connecting the source of the transistor to a ground line with the first conductor. At step 535, the read only memory cell is programmed to logic zero.

Figure 6:
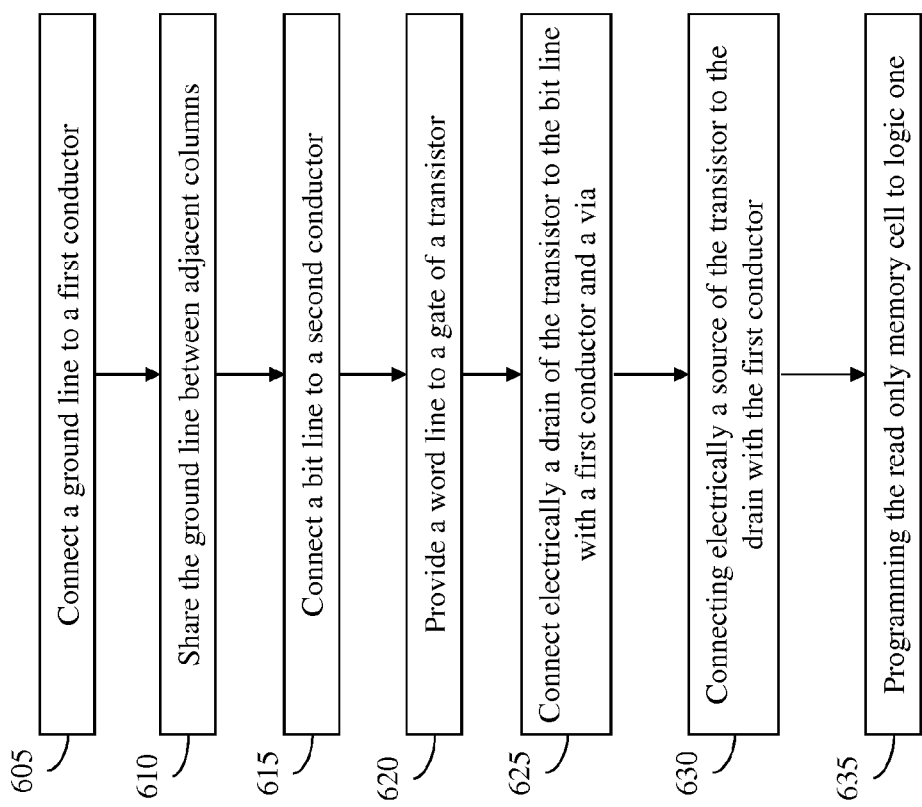
FIG. 6 is an exemplary flowchart of a method for manufacturing a read only memory, cell in accordance with another embodiment.

FIG. 6 is an exemplary flowchart of a method for manufacturing a read only memory, cell in accordance with another embodiment.

At step 605, a ground line is connected to the first conductor. At step 610, a ground line is shared between adjacent columns. At step 615, a bit line is connected to a second conductor. At step 620, a word line is connected to the gate of a transistor. At step 625, a drain of the transistor is electrically connected to the bit line with a first conductor and a via. At step 630, a source of the transistor is electrically connected with the first conductor. At step 635, the read only memory cell is programmed to logic one.

Figure 7:
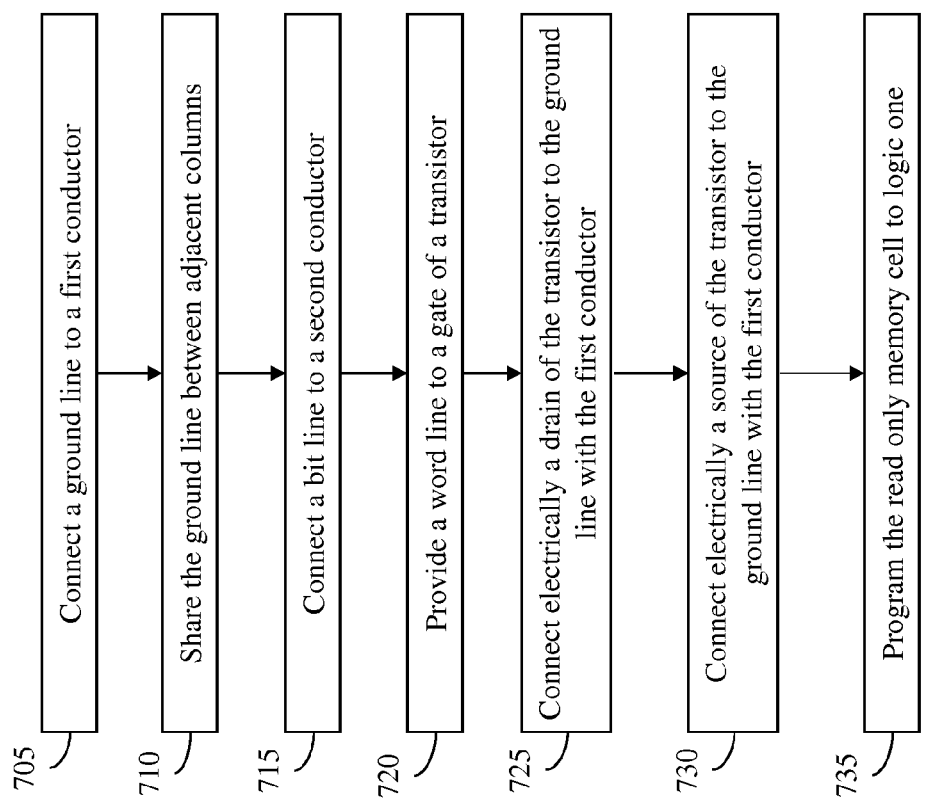
FIG. 7 is an exemplary flowchart of a method for manufacturing a read only memory cell, in accordance with yet another embodiment.

FIG. 7 is an exemplary flowchart of a method for manufacturing a read only memory cell, in accordance with yet another embodiment.

At step 705, a ground line is connected to the first conductor. At step 710, a ground line is shared between adjacent columns. At step 715, a bit line is connected to a second conductor. At step 720, a word line is connected to the gate of a transistor. At step 725, a drain of the transistor is electrically connected to the ground line with first conductor. At step 730, a source of the transistor is electrically connected to the ground line with the first conductor. At step 735, the read only memory cell is programmed to logic one.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is clamed is:

1. A method of manufacturing a read only memory cell, the method comprising:
connecting a ground line to a first ground conductor;
sharing the ground line between adjacent columns whereby the first ground conductor is the only conductor in the read only memory cell which meets a design rule, wherein the design rule specifies an area to be occupied by the first ground conductor;
connecting a bit line to a second conductor;
connecting a word line to a gate of a transistor;
connecting electrically a drain of the transistor to the bit line with a first conductor that is separated from the second conductor by a poly layer and connected to the second conductor through a via; and programming the read only memory cell to logic zero by electrically connecting a source of the transistor to the first ground conductor.

2. The method of claim 1, further comprising: pre-charging and discharging the bit line, and inputs provided by the word line.

3. The method of claim 1 wherein the first ground conductor meets the design rule, wherein the design rule specifies an area to be occupied by the first ground conductor after programming the read only memory cell to logic zero.

4. The method of claim 1 wherein electrically connecting the source of the transistor to the first ground conductor comprises connecting the source to the first ground conductor through another conductor.

5. The method of claim 1 wherein sharing the ground line comprises physically sharing the ground line.

6. The method of claim 1 wherein the source and the drain are covered with the first conductor, thereby meeting the design rule, wherein the design rule specifies an area to be occupied by the first ground conductor.

7. The method of claim 2, wherein the pre-charging and discharging the bit line facilitate programming the read only memory cell to logic zero.

8. The method of claim 2, wherein the pre-charging and discharging the inputs provided by the word line facilitate programming the read only memory cell to logic zero.

9. The method of claim 4 wherein the first ground conductor meets the design rule, wherein the design rule specifies an area to be occupied by the first ground conductor after programming the read only memory cell to logic zero.

10. The method of claim 6, wherein the drain and the source are physically connected to the bit line.

11. The method of claim 6, wherein the drain and the source are physically connected to each other.

12. The method of claim 6, wherein the drain and the source are physically connected to the ground line.

13. A method of manufacturing a read only memory cell, the method comprising:

connecting a ground line to a first ground conductor;

sharing the ground line between adjacent columns whereby the first ground conductor is the only conductor in the read only memory cell which meets a design rule, wherein the design rule specifies an area to be occupied by the first ground conductor;

connecting a bit line to a second conductor;

connecting a word line to a gate of a transistor;

connecting electrically a drain of the transistor to the bit line with a first conductor that is separated from the second conductor by a poly layer and connected to the second conductor through a via;

programming the read only memory cell to logic zero by electrically connecting a source of the transistor to the first ground conductor; and covering the drain and the source with a same first conductor.

14. The method of claim 13, further comprising physically connecting both the drain and source of the transistor to each other and the bit line.

15. The method of claim 13, wherein the drain and the source are physically connected to the bit line.

16. A method of manufacturing a read only memory cell, the method comprising:

connecting a ground line to a first ground conductor;

sharing the ground line between adjacent columns whereby the first ground conductor is the only conductor in the read only memory cell which meets a design rule, wherein the design rule specifies an area to be occupied by the first ground conductor;

connecting a bit line to a second conductor;

connecting a word line to a gate of a transistor;

connecting electrically a drain of the transistor to the bit line with a first conductor that is separated from the second conductor by a poly layer and connected to the second conductor through a via; and programming the read only memory cell to logic one.

17. The method of claim 16, further comprising: pre-charging and discharging the bit line, and inputs provided by the word line.

18. The method of claim 16, wherein the drain and the source are physically connected to the bit line.

19. The method of claim 17, wherein the pre-charging and discharging the bit line facilitate programming the read only memory cell to logic one.

20. The method of claim 17, wherein the pre-charging and discharging the inputs provided by the word line facilitate programming the read only memory cell to logic zero.

* * * * *